US012795981B2

(12) United States Patent
Park et al.

(10) Patent No.: US 12,795,981 B2
(45) Date of Patent: Nov. 10, 2026

(54) TRANSISTOR BASED ON COMPACT DRAIN AND HETERO-MATERIAL STRUCTURE

(71) Applicant: IUCF-HYU (INDUSTRY-UNIVERSITY COOPERATION FOUNDATION HANYANG UNIVERSITY), Seoul (KR)

(72) Inventors: Jea Gun Park, Seoul (KR); Jin Pyo Hong, Seoul (KR); Min Won Kim, Seoul (KR); Byoung Seok Lee, Seoul (KR); Ji Hun Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 362 days.

(21) Appl. No.: 18/578,739

(22) PCT Filed: Jul. 12, 2022

(86) PCT No.: PCT/KR2022/010146
§ 371 (c)(1),
(2) Date: Jan. 12, 2024

(87) PCT Pub. No.: WO2023/287174
PCT Pub. Date: Jan. 19, 2023

(65) Prior Publication Data
US 2024/0322031 A1 Sep. 26, 2024

(30) Foreign Application Priority Data
Jul. 12, 2021 (KR) ........................ 10-2021-0091201

(51) Int. Cl.
*H10D 62/83* (2025.01)
*H10D 30/47* (2025.01)
(Continued)

(52) U.S. Cl.
CPC ......... *H10D 30/477* (2025.01); *H10D 62/151* (2025.01); *H10D 62/83* (2025.01); *H10P 90/1908* (2026.01); *H10W 10/181* (2026.01)

(58) Field of Classification Search
CPC .... H10D 12/00; H10D 12/211; H10D 30/477; H10D 62/151; H10D 62/83; H10D 62/10;
(Continued)

(56) References Cited

U.S. PATENT DOCUMENTS 6,399,970 B2 * 6/2002 Kubo .................. H10D 62/221 257/E29.05
8,492,846 B2 * 7/2013 Zhu ...................... H10D 30/795 257/E21.546

(Continued)

FOREIGN PATENT DOCUMENTS

KR 20040051505 A 6/2004
KR 101399195 B1 5/2014

(Continued)

OTHER PUBLICATIONS

Shivendra Yadav et al., "A novel design approach of charge plasma tunnel FET for radio frequency applications" Journal of Semiconductors, 2019, 40(5), Feb. 8, 2019, total 8pages.

(Continued)

*Primary Examiner* — Omar F Mojaddedi
(74) *Attorney, Agent, or Firm* — NKL Law; Jae Youn Kim

(57) ABSTRACT

The present invention relates to a transistor based on a compact drain and hetero-material structure. The transistor according to one embodiment includes substrates including
(Continued)

a buried oxide (BOX) layer and active layers formed on the buried oxide layer; an insulating layer formed on the substrates; and electrode layers formed on the insulating layer and including a drain electrode, a gate electrode, and a source electrode. The active layers include a first semiconductor layer corresponding to a drain region, a second semiconductor layer corresponding to a channel region, and a third semiconductor layer corresponding to a source region. The first semiconductor layer is formed to be thinner than the second semiconductor layer, and the third semiconductor layer is formed of a material having a band gap lower than that of the second semiconductor layer.

9 Claims, 10 Drawing Sheets

(51) Int. Cl.
*H10D 62/13* (2025.01)
*H10P 90/00* (2026.01)
*H10W 10/10* (2026.01)

(58) Field of Classification Search
CPC ...... H10D 62/13; H10D 62/17; H10D 62/122; H10D 62/235; H10D 64/23; H10D 64/252; H10P 90/1908; H10W 10/181
See application file for complete search history.

(56) References Cited

U.S. PATENT DOCUMENTS

| | | | | |
|---|---|---|---|---|
| 9,123,802 | B2 * | 9/2015 | Mathur | H10D 30/668 |
| 9,570,359 | B2 * | 2/2017 | Yang | H10D 84/0167 |
| 12,336,223 | B2 * | 6/2025 | Park | H10D 30/6755 |
| 2021/0020747 | A1 | 1/2021 | Chen | |
| 2021/0036137 | A1 | 2/2021 | Cea et al. | |
| 2021/0143263 | A1 * | 5/2021 | Convertino | H10D 12/021 |
| 2021/0343578 | A1 * | 11/2021 | Chang | H10D 30/014 |

FOREIGN PATENT DOCUMENTS

| | | | |
|---|---|---|---|
| KR | 20170004676 | A | 1/2017 |
| KR | 102102062 | B1 | 4/2020 |

OTHER PUBLICATIONS

Tao Han et al., "A Doping-Less Tunnel Field-Effect Transistor with Si0.6Ge0.4 Heterojunction for the Improvement of the On-Off Current Ratio and Analog/RF Performance", Electronics, 2019, 8, 574; May 24, 2019, total 10 pages.

Chiu-Ting Wand et al., "III-V Heterojunction TFET with Bandgap Engineering for Performance Enhancement and Ambipolar Leakage Suppression" International Conference on Solid State Devices and Materials, Sendai, 2017, pp. 747-748.

* cited by examiner

210

220

230

240

250

260

270

TRANSISTOR BASED ON COMPACT DRAIN AND HETERO-MATERIAL STRUCTURE

STATEMENT DESIGNATING GRACE PERIOD INVENTOR DISCLOSURES

Applicant informs that the thesis "Doping-less tunnel field-effect transistors by compact Si drain frame/Si0.6Ge0.4-channel/Ge source" containing the subject matter of this application was disclosed by the inventor or joint inventor or by another who obtained the subject matter disclosed directly or indirectly from the inventor or joint inventor on Apr. 2, 2021 (which is one year or less before the effective filing date of a claimed invention) which does not quality as prior art under 35 U.S.C. 102(b) in the following website:

https://pubs.aip.org/aip/adv/article/11/4/045007/976519/Doping-less-tunnel-field-effect-transistors-by?searchresult=1

TECHNICAL FIELD

The present invention relates to a transistor having horizontal and vertical structures, and more particularly, to the technical idea of improving the ambipolar current and on-current characteristics of a transistor.

BACKGROUND ART

Currently, metal-oxide-semiconductor field-effect transistors (MOSFETs), which have excellent electrical characteristics such as high switching speed and high-frequency operation, are used as switching devices in integrated circuits.

However, MOSFETs cannot reduce subthreshold swing (SS) below 60 mV/dec due to the operation characteristics thereof, so the MOSFETs have limitations in satisfying voltage scale-down required for semiconductor integration.

Accordingly, unlike MOSFETs, tunnel field-effect transistors (TTFTs), which operate through tunneling between source-channel-drain without depletion and inversion of a channel region and have no SS limit of 60 mV/dec, are being studied as low-power devices to replace MOSFETs.

Specifically, TFETs have a p(source)-i(channel)-n(drain) structure. In addition, TFETs have SS of 60 mV/dec or less, so the TFETs have low power characteristics characterized by fast switching and being driven at a low driving voltage (VDD). In particular, TFETs have a lower off-current than existing MOSFETs, which can reduce standby power consumption.

However, since current is induced in TFETs through the quantum tunneling phenomenon between the valence band and the conduction band for each region, the TFETs have limitations in securing high on-current characteristics.

In addition, in the case of TFETs, when a negative voltage is applied to a gate, the tunneling width between the conduction band of a drain region and a channel decreases, and electronic tunneling becomes possible, allowing ambipolar current to flow. Accordingly, to replace existing MOSFETs, it is necessary to secure high on-current and suppress ambipolar current.

Therefore, research to improve on-current and ambipolar current in TFETs is continuing. However, existing studies on the above improvements have the problem that actual implementation is difficult due to difficult processes.

DISCLOSURE

Technical Problem

Therefore, the present invention has been made in view of the above problems, and it is one object of the present invention to provide a transistor capable of reducing ambipolar current and increasing on-current by applying a compact drain, dopingless, and a hetero-material structure.

It is another object of the present invention to provide a transistor capable of being fabricated through a simple process, thereby enabling mass production at low unit cost.

Technical Solution

In accordance with one aspect of the present invention, provided is a transistor having a horizontal structure, the transistor including substrates including a buried oxide (BOX) layer and active layers formed on the buried oxide layer; an insulating layer formed on the substrates; and electrode layers formed on the insulating layer and including a drain electrode, a gate electrode, and a source electrode, wherein the active layers include a first semiconductor layer corresponding to a drain region, a second semiconductor layer corresponding to a channel region, and a third semiconductor layer corresponding to a source region, wherein the first semiconductor layer is formed to be thinner than the second semiconductor layer, and the third semiconductor layer is formed of a material having a band gap lower than that of the second semiconductor layer.

According to one aspect of the present invention, in the electrode layers, the drain electrode may be formed of a material having a first work function, the gate electrode may be formed of a material having a second work function greater than the first work function, and the source electrode may be formed of a material having a third work function greater than the second work function.

According to one aspect of the present invention, in the electrode layers, the drain electrode may include at least one of hafnium (Hf), tantalum (Ta), and titanium (Ti), the gate electrode may include tungsten (W), and the source electrode may include at least one of platinum (Pt), nickel (Ni), and cobalt (Co).

According to one aspect of the present invention, in the active layers, a silicon (Si) layer having a thickness of 1 nm to 3 nm may be formed as the first semiconductor layer.

According to one aspect of the present invention, in the active layers, a silicon-germanium (SiGe) layer may be formed as the second semiconductor layer, and a germanium (Ge) layer may be formed as the third semiconductor layer.

According to one aspect of the present invention, the second semiconductor layer may be formed of a silicon (Si) material and a germanium (Ge) material in a ratio of 6:4.

According to one aspect of the present invention, the insulating layer may include a drain insulating layer formed on a lower portion of the drain electrode and including silicon oxide ($SiO_2$); a gate insulating layer formed on a lower portion of the gate electrode and including hafnium oxide ($HfO_2$); and a source insulating layer formed on a lower portion of the source electrode and including silicon oxide ($SiO_2$).

In accordance with another aspect of the present invention, provided is a transistor having a vertical structure, the transistor including a semiconductor core including a buried oxide (BOX) with active layers formed on an outer circumferential surface thereof; an insulating layer formed on the semiconductor core; and electrode layers formed on the insulating layer and including a drain electrode, a gate electrode, and a source electrode, wherein the active layers include a first semiconductor layer corresponding to a drain region, a second semiconductor layer formed on a lower portion of the first semiconductor layer and corresponding to a gate region, and a third semiconductor layer formed on a lower portion of the second semiconductor layer and corresponding to a source region, wherein the first semiconductor layer is formed to be thinner than the second semiconductor layer, and the third semiconductor layer is formed of a material having a band gap lower than that of the second semiconductor layer.

According to one aspect of the present invention, in the electrode layers, the drain electrode may be formed of a material having a first work function, the gate electrode may be formed of a material having a second work function greater than the first work function, and the source electrode may be formed of a material having a third work function greater than the second work function.

According to one aspect of the present invention, in the active layers, a silicon (Si) layer having a thickness of 1 nm to 3 nm may be formed as the first semiconductor layer.

According to one aspect of the present invention, in the active layers, a silicon-germanium (SiGe) layer may be formed as the second semiconductor layer, and a germanium (Ge) layer may be formed as the third semiconductor layer.

Advantageous Effects

According to one embodiment, the present invention can reduce ambipolar current and increase on-current by implementing a transistor based on a compact drain, dopingless, and a hetero-material structure.

According to one embodiment, the present invention can provide a transistor capable of being fabricated through a simple process, thereby enabling mass production at low unit cost.

BEST MODE

Figure 1A:
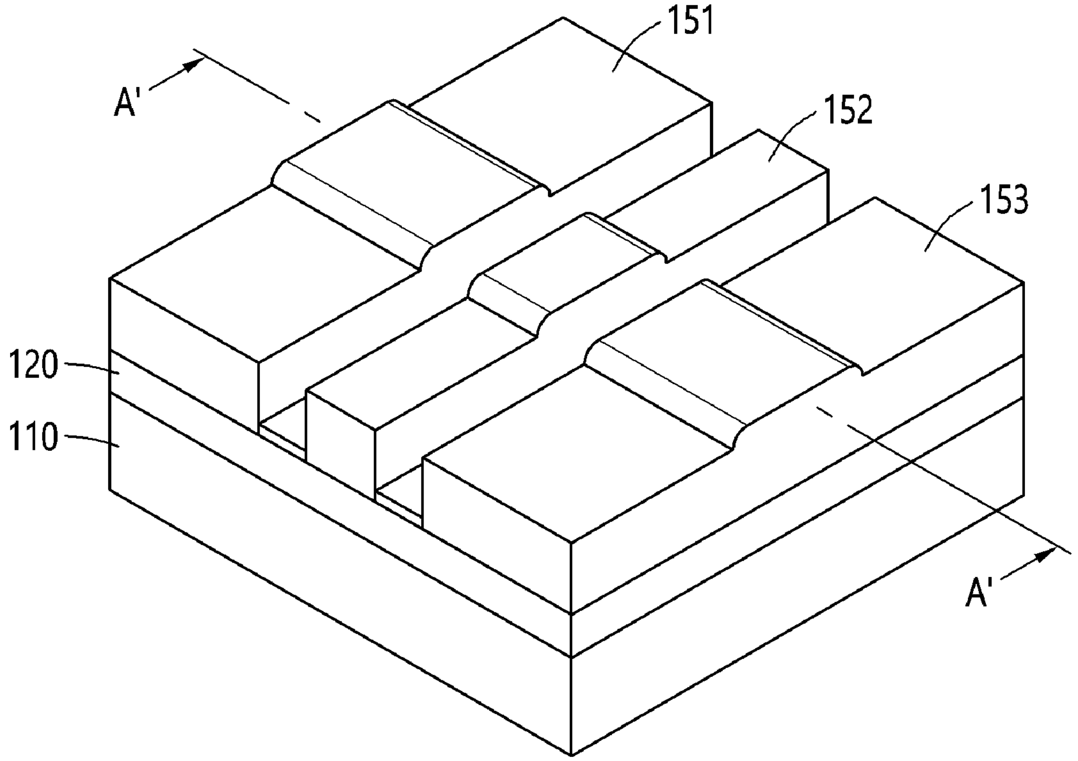
FIGS. 1A and 1B are diagrams for explaining a transistor having a horizontal structure according to one embodiment.

Hereinafter, the embodiments of the present invention will be described in detail with reference to the drawings.

However, it should be understood that the present invention is not limited to the embodiments according to the concept of the present invention, but includes changes, equivalents, or alternatives falling within the spirit and scope of the present invention.

In the following description of the present invention, detailed description of known functions and configurations incorporated herein will be omitted when it may make the subject matter of the present invention unclear.

In addition, the terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as “A or B” and “at least one of A and/or B” may include all possible combinations of the items listed together.

Expressions such as “first” and “second” may be used to qualify the elements irrespective of order or importance, and are used to distinguish one element from another and do not limit the elements.

It will be understood that when an element (e.g., first) is referred to as being “connected to” or “coupled to” another element (e.g., second), the first element may be directly connected to the second element or may be connected to the second element via an intervening element (e.g., third).

As used herein, “configured to” may be used interchangeably with, for example, “suitable for”, “ability to”, “changed to”, “made to”, “capable of”, or “designed to” in terms of hardware or software.

In some situations, the expression “device configured to” may mean that the device “may do ~” with other devices or components.

For example, in the sentence “processor configured to perform A, B, and C”, the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression “or” means “inclusive or” rather than “exclusive or”.

That is, unless mentioned otherwise or clearly inferred from context, the expression “x uses a or b” means any one of natural inclusive permutations.

In the above-described specific embodiments, elements included in the invention are expressed in singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present invention has been described with reference to exemplary embodiments, but it should be understood that various modifications may be made without departing from the scope of the present invention.

Therefore, the scope of the present invention should not be limited by the embodiments, but should be determined by the following claims and equivalents to the following claims.

Figure 1B:
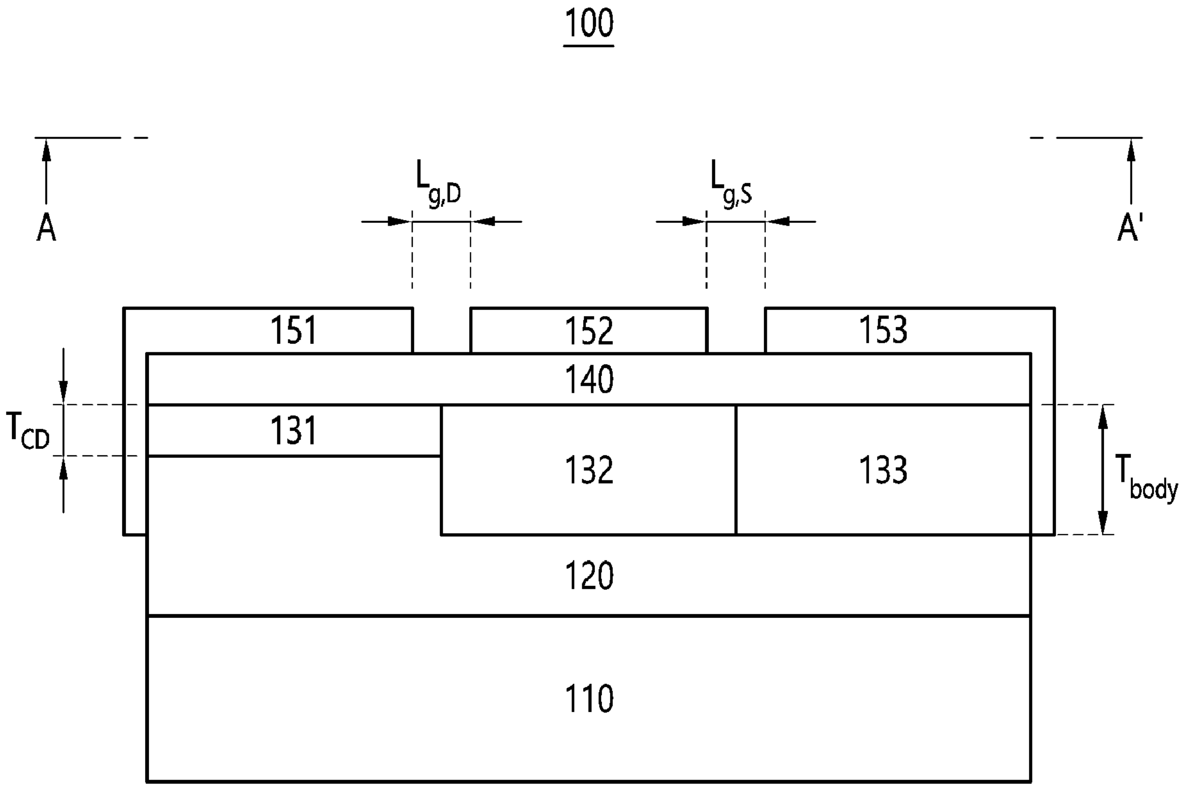
Figure 2A:
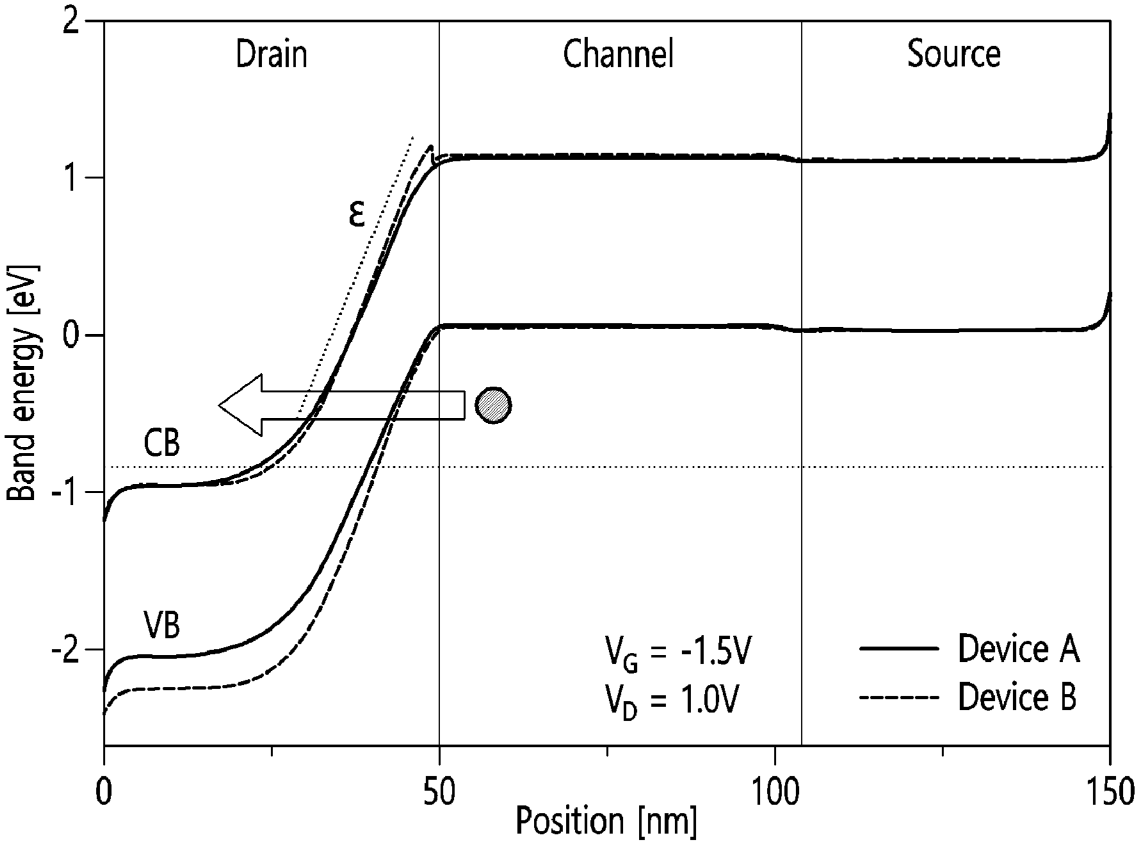
FIGS. 2A to 2G are diagrams for explaining the electrical characteristics of a transistor having a horizontal structure according to one embodiment.
Figure 2B:
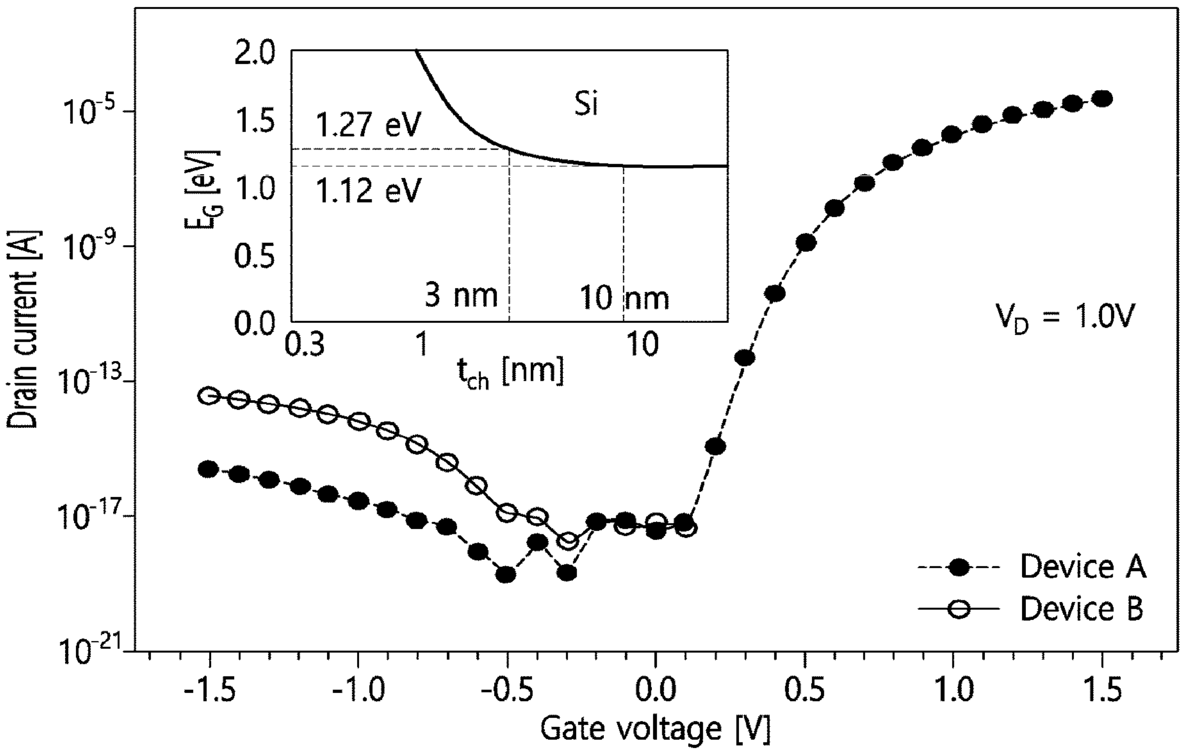
Figure 2C:
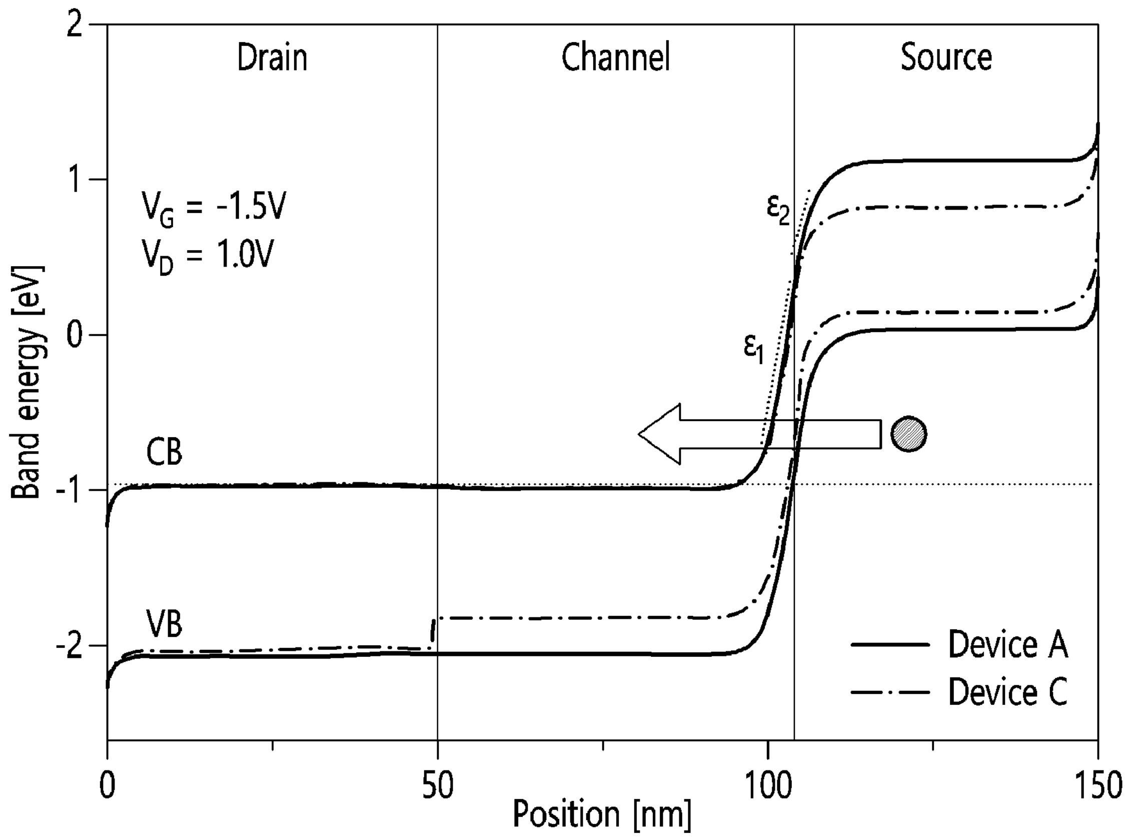
Figure 2D:
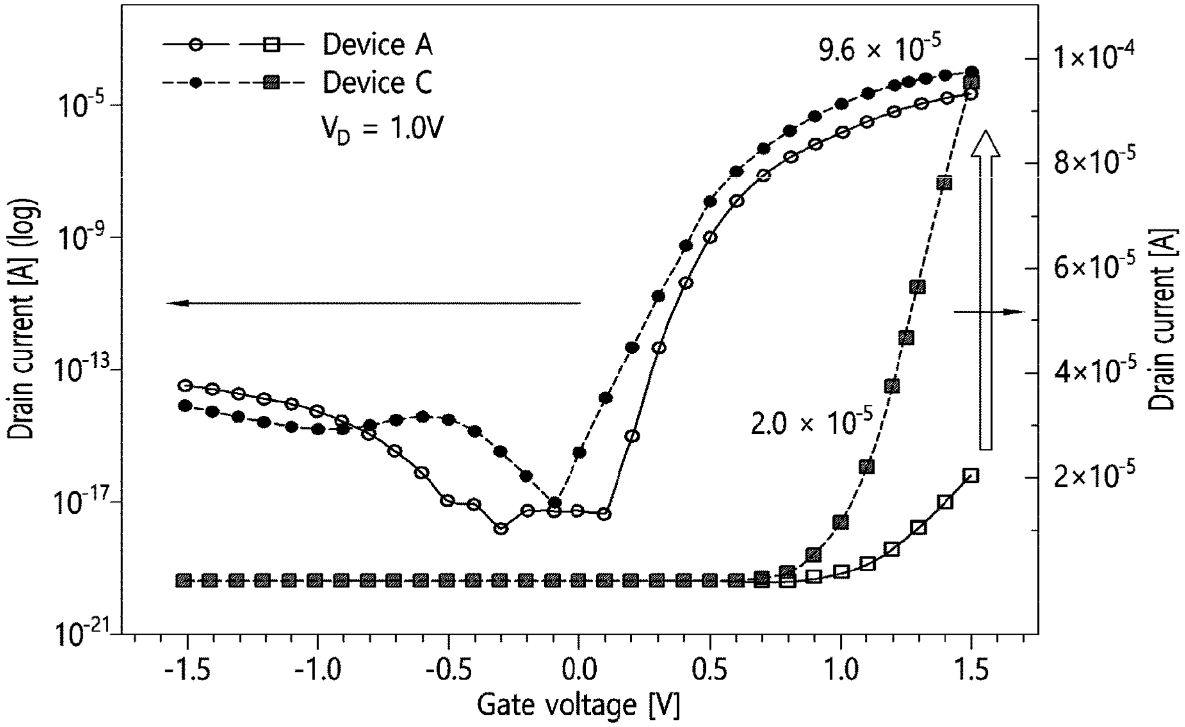
Figure 2E:
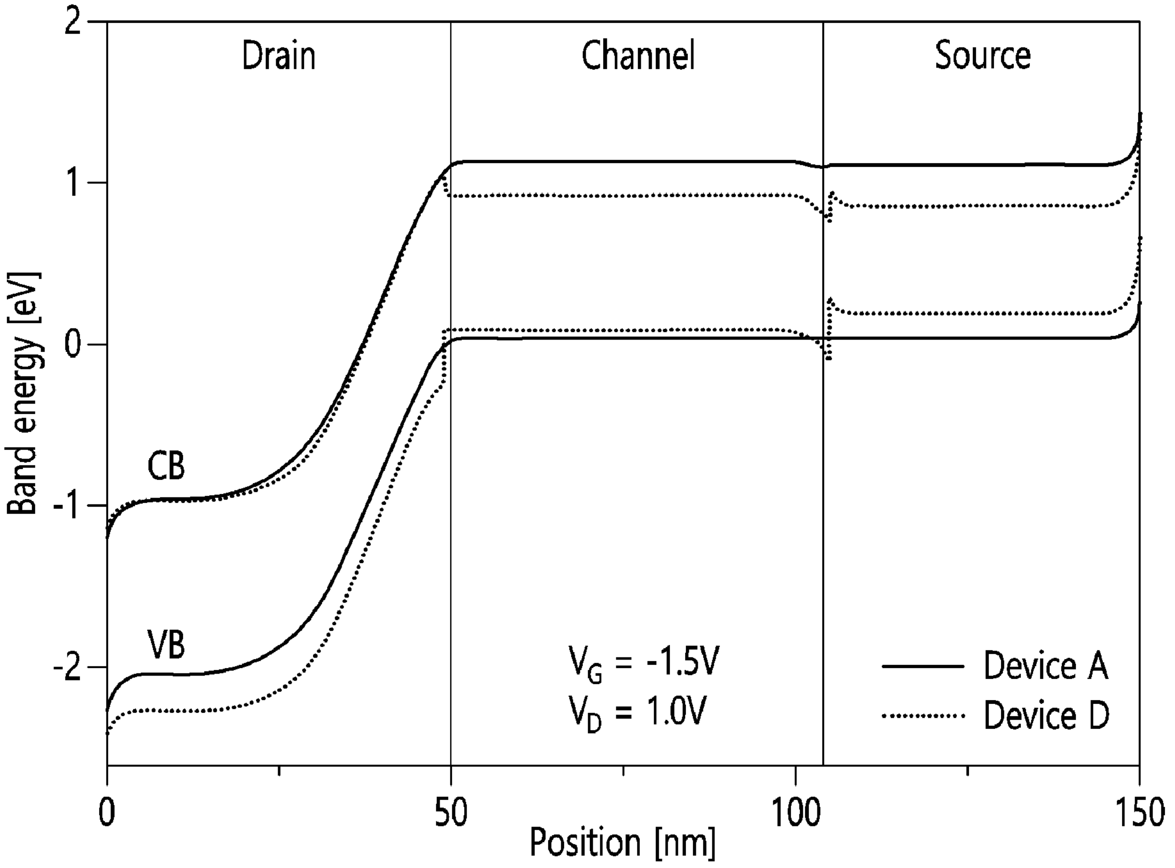
Figure 2F:
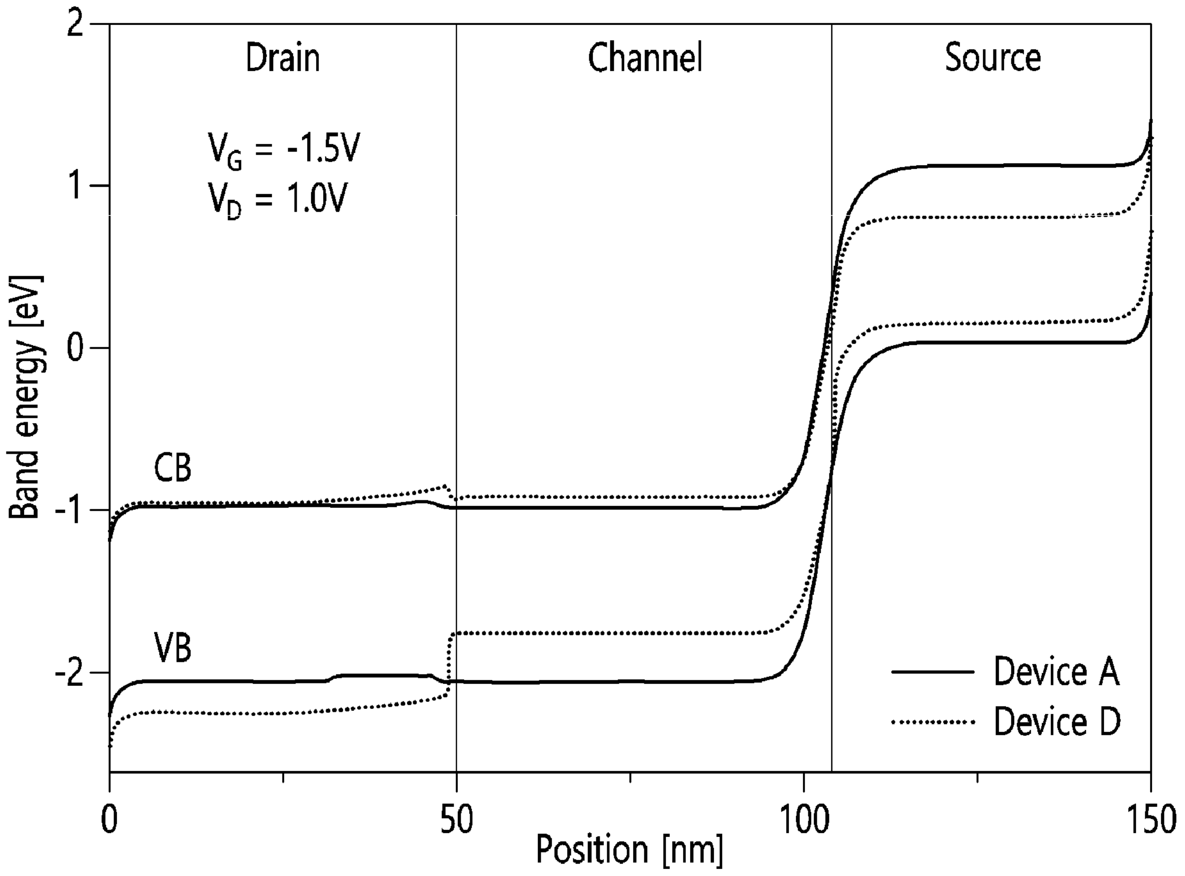
Figure 2G:
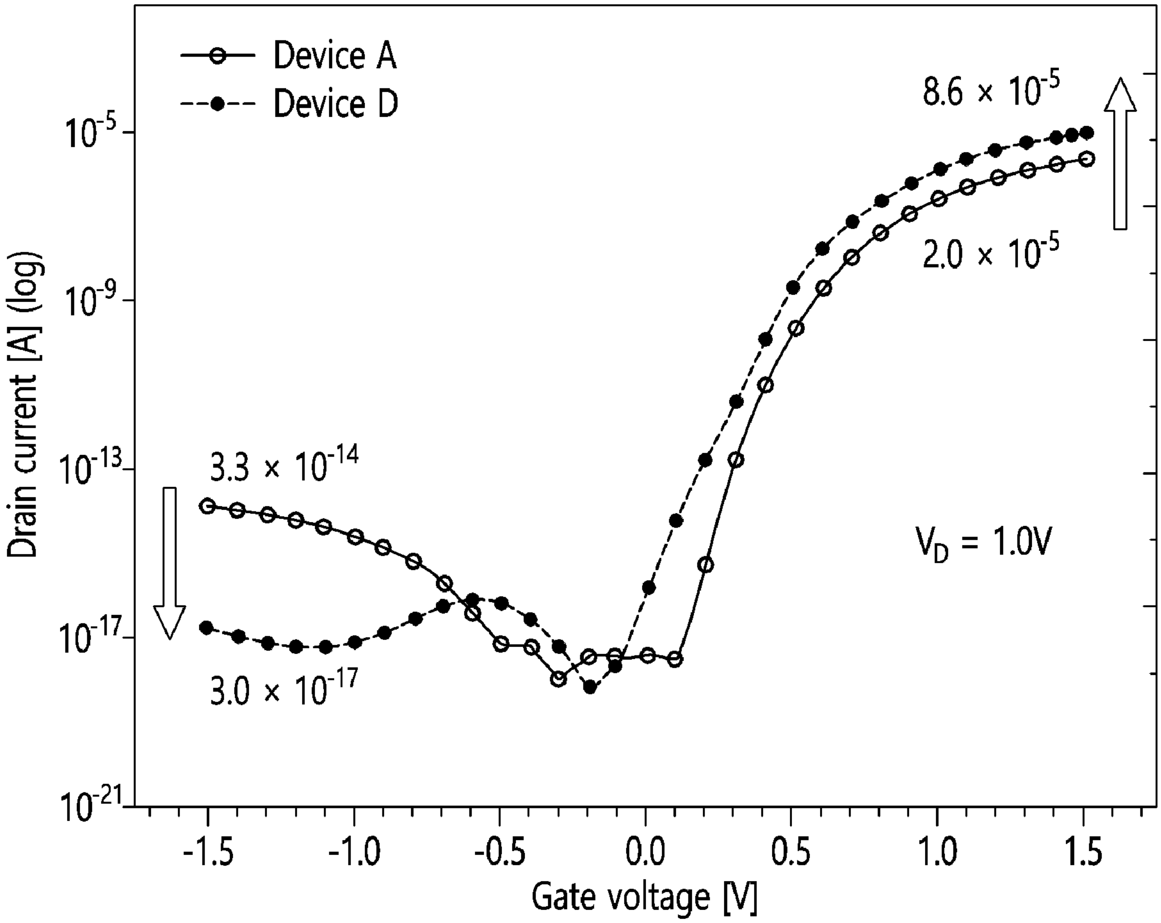

FIGS. 1A and 1B are diagrams for explaining a transistor having a horizontal structure according to one embodiment.

Referring to FIGS. 1A and 1B, FIG. 1A shows a transistor 100 having a horizontal structure according to one embodiment, and FIG. 1B shows the cross-sectional view (A-A') of the transistor 100 shown in FIG. 1A.

According to FIGS. 1A and 1B, the transistor 100 according to one embodiment may reduce ambipolar current and increase on-current by applying a compact drain, dopingless, and a hetero-material structure.

In addition, the transistor 100 may be fabricated through a simple process, and thus may be easily mass-produced at low unit cost.

Accordingly, the transistor 100 according to one embodiment may include substrates 110, 120, 131, 132, and 133, an insulating layer 140 formed on the substrates, and the electrode layers 151, 152, and 153 formed on the insulating layer.

Specifically, the substrates may include the buried oxide (BOX) layer 120 and active layers formed on the buried oxide layer 120, and the active layers may include the first semiconductor layer 131 corresponding to a drain region, the second semiconductor layer 132 corresponding to a channel region (i.e., gate region), and the third semiconductor layer 133 corresponding to a source region.

In addition, the electrode layers may include a drain electrode 151, a gate electrode 152, and a source electrode 153 formed in regions corresponding to the first semiconductor layer 131, the second semiconductor layer 132, and the third semiconductor layer 133, respectively.

For example, the substrate may be a silicon-on-insulator (SOI) substrate, which is formed by laminating the silicon (Si)-based base layer 110, the buried oxide layer 120, and a silicon layer.

According to one aspect of the present invention, the insulating layer 140 may include a drain insulating layer formed on the lower portion of the drain electrode 151, a gate insulating layer formed on the lower portion of the gate electrode 152, and a source insulating layer formed on the lower portion of the source electrode 153. That is, in FIG. 1B, the insulating layer 140 is shown as a single layer, but in the insulating layer 140 according to one embodiment, the drain insulating layer, the gate insulating layer, and the source insulating layer may be formed to be spaced apart from each other in the horizontal direction at preset intervals ($L_{g.D}$, $L_{g.S}$).

For example, in the insulating layer 140, the drain insulating layer and the source insulating layer may include silicon oxide ($SiO_2$), and the gate insulating layer may include hafnium oxide ($HfO_2$).

Specifically, in the insulating layer 140, the drain insulating layer may be formed of silicon oxide ($SiO_2$) with a relatively thick thickness (e.g., 30 Å) to reduce ambipolar current, the gate insulating layer may be formed of hafnium oxide ($HfO_2$) with a relatively thin thickness (e.g., 20 Å), which is a high-k material, to obtain subthreshold swing (SS), and the source insulating layer may be formed of silicon oxide ($SiO_2$) with a relatively thin thickness (e.g., 5 Å) to increase on-current.

According to one aspect of the present invention, for the electrode layers, the gap ($L_{g.D}$) between the drain and the gate and the gap ($L_{g.S}$) between the gate and the source may be optimized to reduce ambipolar current and increase on-current.

For example, the electrode layers may be designed so that the drain-gate gap ($L_{g.D}$) is 15 nm and the gate-source gap ($L_{g.S}$) is 3 nm.

In addition, the electrode layers may be designed so that the lengths of the drain electrode 151, the gate electrode 152, and the source electrode 153 are 32 nm, 50 nm, and 44 nm, respectively.

According to one aspect of the present invention, in the electrode layers, the drain electrode 151 may be formed of a material having a first work function, the gate electrode 152 may be formed of a material having a second work function greater than the first work function, and the source electrode 153 may be formed of a material having a third work function greater than the second work function. For example, the first work function may be 4.25 eV to 4.33 eV, the second work function may be 4.5 eV, and the third work function may be 5.0 eV to 5.15 eV.

According to one aspect of the present invention, in the electrode layers, the drain electrode 151 may include at least one of hafnium (Hf), tantalum (Ta), and titanium (Ti), the gate electrode 152 may include tungsten (W), and the source electrode 153 may include at least one of platinum (Pt), nickel (Ni), and cobalt (Co).

Preferably, in the electrode layers, the drain electrode 151 may be formed as a hafnium (Hf) electrode, the gate electrode 152 may be formed as a tungsten (W) electrode, and the source electrode 153 may be formed as a platinum (Pt) electrode.

Specifically, in the electrode layers, the drain electrode 151 may be formed of a hafnium (Hf) metal having a low work function of 3.9 eV to form n-type charge plasma, the gate electrode 152 may be formed of a tungsten (W) metal having a work function of 4.4 eV similar to the work function of an intrinsic semiconductor (intrinsic silicon), and the source electrode 153 may be formed of a platinum (Pt) metal having a high work function of 5.9 eV to form p-type charge plasma.

That is, in the transistor 100 according to one embodiment, by optimizing the work functions of the drain and source electrodes 151 and 153, based on the charge plasma phenomenon due to the difference in work function between the drain electrode 151 and the first semiconductor layer 131 and the source electrode 153 and the third semiconductor layer 133, the same effect as doping the first semiconductor layer 131 and the third semiconductor layer 133 with n-type and p-type may be obtained.

Here, according to the charge plasma phenomenon, when a junction consisting of metal-insulating film (oxide)-semiconductor is formed, the difference in work function between the metal and the semiconductor causes bending of the energy band of the semiconductor, which makes the semiconductor appear as if the semiconductor is doped with n-type or p-type even though the semiconductor is not directly doped. The charge inside the semiconductor induced at this time is expressed as charge plasma.

That is, the transistor 100 according to one embodiment may solve problems caused by a doping process, such as dopant diffusion, misfit dislocation, random dopant fluctuation (RDF), low throughput, and low mobility characteristics, by applying the same effect as if the semiconductor layer is doped through the charge plasma phenomenon without a direct doping process, and as a result, may improve electrical characteristics.

In addition, in the active layers according to one embodiment, the first semiconductor layer 131 may be formed to be thinner than the second semiconductor layer 132, and the third semiconductor layer 133 may be formed of a material having a band gap lower than that of the second semiconductor layer 132.

Preferably, in the active layers, a silicon (Si) layer having a thickness (TCD) of 1 nm to 3 nm may be formed as the first semiconductor layer 131, a silicon-germanium (SiGe) layer may be formed as the second semiconductor layer 132, and a germanium (Ge) layer may be formed as the third semiconductor layer 133.

For example, the second semiconductor layer 132 may be formed of a silicon (Si) material and a germanium (Ge) material in a ratio of 6:4. That is, the second semiconductor layer 132 may be a semiconductor layer based on $Si_{0.6}Ge_{0.4}$.

In addition, the second and third semiconductor layers 132 and 133 may be formed to have a thickness ($T_{body}$) of 10 nm, so that a uniform charge plasma concentration may be maintained.

Specifically, the transistor 100 according to one embodiment may be designed so that the thickness (TCD) of the first semiconductor layer 131 based on silicon (Si) corresponding to the drain region is less than the thickness ($T_{body}$) of the second and third semiconductor layers 132 and 133. With this configuration, the band gap of the drain region may be increased compared to the channel by the quantum size effect. As a result, when a negative voltage is applied to the gate electrode 152, the tunneling width between the drain and channel regions may be increased and ambipolar current may be suppressed.

In addition, in the transistor 100 according to one embodiment, the second semiconductor layer 132 corresponding to the channel region may be implemented with a silicon-germanium (SiGe) material, and the third semiconductor layer 133 corresponding to the source region may be implemented with a germanium (Ge) material having a lower band gap than that of the silicon-germanium (SiGe) material. In this case, when a positive voltage is applied to the gate electrode 152, the tunneling width between the source and channel regions may be reduced, thereby securing high on-current.

That is, in the transistor 100 according to one embodiment, by applying a compact drain, dopingless, and a hetero-material structure, ambipolar current may be reduced, on-current may be increased, and problems related to a doping process may be solved.

In addition, the transistor 100 may be fabricated through a simple process, and thus may be easily mass-produced at low unit cost.

For example, the substrates of the transistor 100 according to one embodiment may be formed by etching, to a predetermined thickness (e.g., 10 nm), regions corresponding to the channel region and regions on a substrate including the silicon (Si)-based base layer 110, the buried oxide layer 120, and a silicon layer with a thickness of 3 nm or less, and then depositing the second and third semiconductor layers 132 and 133 on the etched channel and source regions, respectively. Here, the unetched silicon layer may be the first semiconductor layer 131.

Next, the transistor 100 according to one embodiment may be formed by sequentially laminating the insulating layer 140 and the electrode layers 151, 152, and 153 on the substrates on which the first to third semiconductor layers 131, 132, and 133 are formed.

That is, as described above, the transistor 100 according to one embodiment may be easily formed through a simple fabrication process.

FIGS. 2A to 2G are diagrams for explaining the electrical characteristics of a transistor having a horizontal structure according to one embodiment.

Referring to FIGS. 2A to 2G, reference number 210 shows the energy band diagram of devices A and B, and reference number 220 shows the comparison results of the electrical characteristics (I-V curve) of devices A and B. Here, the graph inserted into the current-voltage curve graph of reference number 220 shows energy band gaps ($E_G$) depending on silicon (Si) thicknesses ($t_{ch}$).

Reference number 230 shows the energy band diagram of devices A and C, and reference number 240 shows the comparison results of the electrical characteristics (I-V curve) of devices A and C. At reference number 240, the y-axis represents both log scale and linear scale.

Reference numbers 250 and 260 show the energy band diagrams of device A and device D (transistor having a horizontal structure according to one embodiment) depending on gate voltages ($V_G$), and reference number 270 shows the comparison results of the electrical characteristics (I-V curve) of devices A and D.

Devices A to D shown in reference numbers 210 to 270 refer to transistors designed based on the parameters listed in Table 1 below.

TABLE 1

| | | Drain | Gate/channel | Source |
|---|---|---|---|---|
| Electrode material (work function) | | Hf ($\varphi_D$ = 3.9 eV) | W ($\varphi_G$ = 4.6 eV) | Pt ($\varphi_S$ = 5.9 eV) |
| Insulating layer material (Thickness) | | $SiO_2$ (30 Å) | $HfO_2$ (20 Å) | $SiO_2$ (5 Å) |
| Active layer | Device A | Si (10 nm) | Si (10 nm) | Si (10 nm) |
| material | Device B | Si (3 nm) | Si (10 nm) | Si (10 nm) |
| (Thickness) | Device C | Si (10 nm) | SiGe (10 nm) | Ge (10 nm) |
| | Device D | Si (3 nm) | SiGe (10 nm) | Ge (10 nm) |

That is, device A is a transistor including drain, channel, and source regions formed of an Si (Thickness: 10 nm) material, and device B is a transistor (structure with improved ambipolar current characteristics) including drain, channel, and source regions formed of Si (Thickness: 3 nm), Si (Thickness: 10 nm), and Si (Thickness: 10 nm), respectively.

In addition, device C is a transistor (structure with improved on-current characteristics) including drain, channel, and source regions formed of an Si (Thickness: 10 nm), SiGe (Thickness: 10 nm), and Ge (Thickness: 10 nm) materials, respectively, and device D is a transistor (structure with improved ambipolar current and on-current characteristics) including drain, channel, and source regions formed of an Si (Thickness: 3 nm), SiGe (Thickness: 10 nm), and Ge (Thickness: 10 nm) materials, respectively.

Table 2 below shows the comparison results of the band gap ($E_G$), electric field (ε), BTBT probability (band-to-band tunneling rate), and ambipolar current of devices A and B.

TABLE 2

| @$V_G$ = −1.5 V, $V_D$ = 1.0 V | Device A | | Device B |
|---|---|---|---|
| Drain $E_G$ | 1.12 eV | < | 1.27 eV |
| Electric field ε @ Drain-channel | $9.8 \times 10^5$ V/cm | > | $9.3 \times 10^5$ V/cm |
| BTBT probability@ Drain-channel | $1.59 \times 10^{23}$ #/cm$^3$ · s | > | $1.08 \times 10^{21}$ #/cm$^3$ · s |
| Ambipolar-current | $3.3 \times 10^{-14}$ A | > | $2.4 \times 10^{-16}$ A |

Referring to reference numbers 210 and 220 and Table 2, the drain region of device B is formed to be thinner than the drain region of device A, and thus the band gap of the drain region of device B increases. Accordingly, when a negative voltage is applied to a gate electrode, since the BTBT probability between the drain and the channel decreases and the tunneling probability between the drain and channel regions decreases, device B has a lower ambipolar current than that of device A.

Specifically, at a gate voltage ($V_G$) of −1.5 V, device A exhibits an ambipolar current of $3.3 \times 10^{-14}$ A, and device B exhibits an ambipolar current of $2.4\times10^{-16}$ A. This result shows that the ambipolar current of device B is about 1/100 of that of device A.

That is, it can be confirmed that device B has the effect of reducing ambipolar current due to the compact drain structure thereof.

Table 3 below shows the magnitude comparison results of the band gap ($E_G$), electric field (ε), BTBT probability, and on-current of devices A and C.

TABLE 3

| @$V_G$ = 1.5 V, $V_D$ = 1.0 V | Device A | | Device C |
|---|---|---|---|
| Channel/source $E_G$ | 1.12/1.12 eV | < | 0.84/0.64 eV |
| Electric field ε@ Drain-channel | $2.6\times10^{6}$ V/cm | < | $3.2\times10^{6}$ V/cm |
| BTBT probability@ Drain-channel | $4.25\times10^{32}$ #/cm$^3\cdot$s | < | $1.17\times10^{33}$ #/cm$^3\cdot$s |
| On-current | $2.0\times10^{-5}$ A | < | $9.6\times10^{-5}$ A |

Referring to reference numbers 230 and 240 and Table 3, device C has a hetero-material structure. In device C, by applying a silicon (Si) drain region, a silicon-germanium (SiGe) channel region, and a germanium (Ge) source region, the energy band gap of the channel and source regions is reduced. Accordingly, when a positive voltage is applied to a gate electrode, the BTBT probability between the channel and source regions increases. Since the tunneling probability between the channel and source regions increases, device C has a higher on-current than that of device A.

Specifically, at a gate voltage ($V_G$) of +1.5 V, device A exhibits an on-current of $2.0\times10^{-5}$ A and device C exhibits an on-current of $9.6\times10^{-5}$ A. This result shows that the on-current of device C is about 5 times that of device A.

That is, in device C, by applying a hetero-material structure, the effect of increasing on-current is obtained.

Table 4 below shows the magnitude comparison results of the ambipolar current and on-current of device A and device D (transistor according to one embodiment).

TABLE 4

| @$V_D$ = 1.0 V | Device A | | Device D |
|---|---|---|---|
| Ambipolar current | $3.3\times10^{-14}$ A | > | $3.0\times10^{-17}$ A |
| On-current | $2.0\times10^{-5}$ A | < | $8.6\times10^{-5}$ A |

Referring to reference numbers 250 to 270 and Table 4, device D is a transistor having both compact drain and hetero-material structure. In device D, the band gap of a drain region increases, and the energy band gap of channel and source regions decreases. Accordingly, when a negative voltage is applied to a gate electrode, the BTBT probability between the drain and the channel decreases. When a positive voltage is applied to the gate electrode, the BTBT probability between the channel and source increases.

That is, in device D, since the tunneling probability between the drain and the channel decreases and the tunneling probability between the channel and the source increases, device D has a lower ambipolar current than that of device A, and device D has a higher on-current than that of device A.

Specifically, the ambipolar current and on-current of device A are $3.3\times10^{-14}$ A and $2.0\times10^{-5}$ A, respectively. The ambipolar current and on-current of device D are $3.0\times10^{-17}$ A and $8.6\times10^{-5}$ A, respectively. These results show that the ambipolar current of device D is about 1/100 of that of device A and the on-current of device D is 4 times that of device A.

That is, since device D (transistor according to one embodiment) has both compact drain and hetero-material structure, device D may implement the effect of reducing ambipolar current and increasing on-current.

Figure 3:
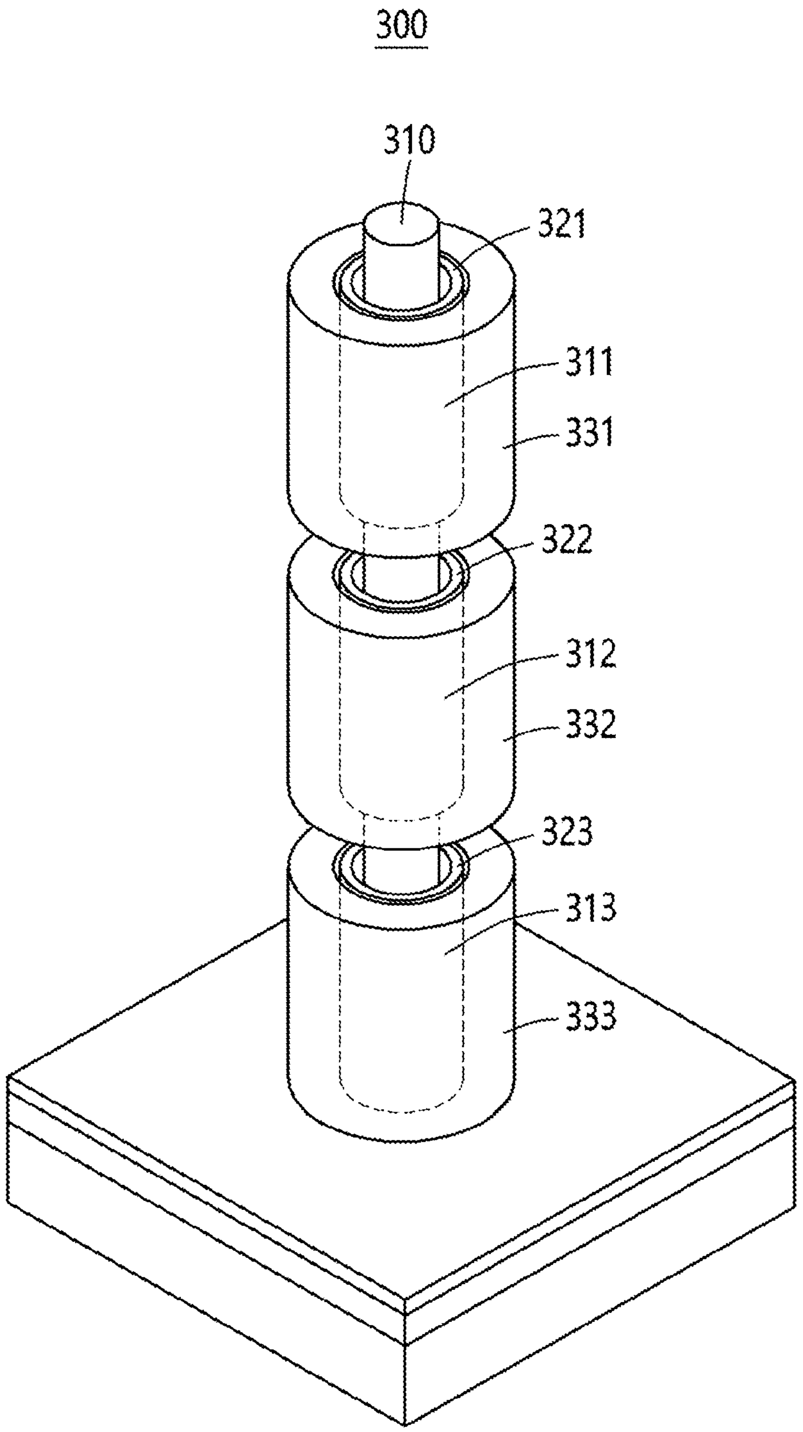
FIG. 3 is a diagram for explaining a transistor having a vertical structure according to another embodiment.

FIG. 3 is a diagram for explaining a transistor having a vertical structure according to another embodiment.

That is, FIG. 3 is a diagram for explaining another embodiment of the transistor having a horizontal structure according to one embodiment described with reference to FIGS. 1A to 2G. Accordingly, among the content explained in FIG. 3, content that overlaps with the content explained in FIGS. 1A to 2G will be omitted.

Referring to FIG. 3, a transistor 300 according to another embodiment may include a semiconductor core 310 including a buried oxide (BOX) with active layers 311, 312, and 313 formed on the outer circumferential surface thereof, insulating layers 321, 322, and 323 formed on the semiconductor core 310, and electrode layers 331, 332, and 333 formed on the insulating layers 321, 322, and 323.

Here, the electrode layers may include a drain electrode 331, a gate electrode 332 and a source electrode 333, and the insulating layers may include a drain insulating layer 321, a gate insulating layer 322, and a source insulating layer 323.

For example, in the insulating layers, the drain and source insulating layers 321 and 323 may include silicon oxide ($SiO_2$), and the gate insulating layer 322 may include hafnium oxide ($HfO_2$).

According to one aspect of the present invention, the electrode layers may be designed so that the gap between the drain and gate electrodes 331 and 332 is greater than or equal to a preset critical gap. With this configuration, in the drain current-gate voltage (ID-$V_G$) characteristics, ambipolar current may be reduced.

Specifically, in the insulating layers, the drain insulating layer 321 may be formed of silicon oxide ($SiO_2$) with a relatively thick thickness (e.g., 30 Å) to reduce ambipolar current, the gate insulating layer 322 may be formed of hafnium oxide ($HfO_2$) with a relatively thin thickness (e.g., 20 Å), which is a high-k material, to obtain subthreshold swing (SS), and the source insulating layer 323 may be formed of silicon oxide ($SiO_2$) with a relatively thin thickness (e.g., 5 Å) to increase on-current.

According to one aspect of the present invention, in the electrode layers, the drain electrode 331 may be formed of a material having a first work function, the gate electrode 332 may be formed of a material having a second work function greater than the first work function, and the source electrode 333 may be formed of a material having a third work function greater than the second work function.

For example, in the electrode layers, the drain electrode 331 may include at least one of hafnium (Hf), tantalum (Ta), and titanium (Ti), the gate electrode 332 may include tungsten (W), and the source electrode 333 may include at least one of platinum (Pt), nickel (Ni), and cobalt (Co).

Preferably, in the electrode layers, the drain electrode 331 may be formed as a hafnium (Hf) electrode, the gate electrode 332 may be formed as a tungsten (W) electrode, and the source electrode 333 may be formed as a platinum (Pt) electrode.

In addition, active layers according to another embodiment may include a first semiconductor layer 311 corresponding to a drain region, a second semiconductor layer 312 formed on a lower portion of the first semiconductor layer 311 and corresponding to a gate region, and a third semiconductor layer 313 formed on a lower portion of the second semiconductor layer 312 and corresponding to a source region.

In addition, in the active layers, the first semiconductor layer 311 may be formed to be thinner than the second semiconductor layer 312, and the third semiconductor layer 313 may be formed of a material having a band gap lower than that of the second semiconductor layer 312.

Preferably, in the active layers, a silicon (Si) layer having a thickness (TCD) of 1 nm to 3 nm may be formed as the first semiconductor layer 311, a silicon-germanium (SiGe) layer may be formed as the second semiconductor layer 312, and a germanium (Ge) layer may be formed as the third semiconductor layer 313.

In conclusion, when the present invention is used, by implementing a transistor based on a compact drain, dopingless, and a hetero-material structure, ambipolar current may be reduced, and on-current may be increased.

In addition, when the present invention is used, a transistor capable of being easily mass-produced at low unit cost through a simple fabrication process may be provided.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A transistor having a horizontal structure, comprising:

substrates comprising a buried oxide (BOX) layer and active layers formed on the buried oxide layer;

an insulating layer formed on the substrates; and electrode layers formed on the insulating layer and comprising a drain electrode, a gate electrode, and a source electrode, wherein the active layers comprise a first semiconductor layer corresponding to a drain region, a second semiconductor layer corresponding to a channel region, and a third semiconductor layer corresponding to a source region, wherein the first semiconductor layer is formed to be thinner than the second semiconductor layer, and the third semiconductor layer is formed of a material having a band gap lower than that of the second semiconductor layer, wherein the second semiconductor layer and the third semiconductor layer are formed by etching regions of a silicon layer formed on the buried oxide layer, the regions corresponding to the channel region and the source region, and then depositing the second semiconductor layer and the third semiconductor layer on the etched channel region and the etched source region, respectively, and wherein an unetched silicon layer is formed as the first semiconductor layer.

2. The transistor according to claim 1, wherein, in the electrode layers, the drain electrode is formed of a material having a first work function, the gate electrode is formed of a material having a second work function greater than the first work function, and the source electrode is formed of a material having a third work function greater than the second work function.

3. The transistor according to claim 2, wherein, in the electrode layers, the drain electrode comprises at least one of hafnium (Hf), tantalum (Ta), and titanium (Ti), the gate electrode comprises tungsten (W), and the source electrode comprises at least one of platinum (Pt), nickel (Ni), and cobalt (Co).

4. The transistor according to claim 1, wherein, in the active layers, a silicon (Si) layer having a thickness of 1 nm to 3 nm is formed as the first semiconductor layer.

5. The transistor according to claim 1, wherein, in the active layers, a silicon-germanium (SiGe) layer is formed as the second semiconductor layer, and a germanium (Ge) layer is formed as the third semiconductor layer.

6. The transistor according to claim 5, wherein the second semiconductor layer is formed of a silicon (Si) material and a germanium (Ge) material in a ratio of 6:4.

7. The transistor according to claim 1, wherein the insulating layer comprises a drain insulating layer formed on a lower portion of the drain electrode and comprising silicon oxide ($SiO_2$); a gate insulating layer formed on a lower portion of the gate electrode and comprising hafnium oxide ($HfO_2$); and a source insulating layer formed on a lower portion of the source electrode and comprising silicon oxide ($SiO_2$).

8. A transistor having a vertical structure, comprising:

a semiconductor core comprising a buried oxide (BOX) with active layers formed on an outer circumferential surface thereof;

an insulating layer formed on the semiconductor core; and electrode layers formed on the insulating layer and comprising a drain electrode, a gate electrode, and a source electrode, wherein the active layers comprise a first semiconductor layer corresponding to a drain region, a second semiconductor layer formed on a lower portion of the first semiconductor layer and corresponding to a gate region, and a third semiconductor layer formed on a lower portion of the second semiconductor layer and corresponding to a source region, wherein the first semiconductor layer is formed to be thinner than the second semiconductor layer, and the third semiconductor layer is formed of a material having a band gap lower than that of the second semiconductor layer, wherein, in the active layers, a silicon (Si) layer having a thickness of 1 nm to 3 nm is formed as the first semiconductor layer, a silicon-germanium (SiGe) layer is formed as the second semiconductor layer, and a germanium (Ge) layer is formed as the third semiconductor layer.

9. The transistor according to claim 8, wherein, in the electrode layers, the drain electrode is formed of a material having a first work function, the gate electrode is formed of a material having a second work function greater than the first work function, and the source electrode is formed of a material having a third work function greater than the second work function.

* * * * *